(12) United States Patent
Udagawa

(10) Patent No.: US 7,479,731 B2
(45) Date of Patent: Jan. 20, 2009

(54) MULTICOLOR LIGHT-EMITTING LAMP AND LIGHT SOURCE

(75) Inventor: Takashi Udagawa, Chichibu (JP)

(73) Assignee: Showa Denko K.K., Tokyo (JP)

(*) Notice: Subject to any disclaimer, the term of this patent is extended or adjusted under 35 U.S.C. 154(b) by 206 days.

(21) Appl. No.: 10/486,985

(22) PCT Filed: Aug. 16, 2002

(86) PCT No.: PCT/JP02/08317

§ 371 (c)(1),
(2), (4) Date: Feb. 18, 2004

(87) PCT Pub. No.: WO03/017387

PCT Pub. Date: Feb. 27, 2003

(65) Prior Publication Data

US 2004/0183089 A1  Sep. 23, 2004

Related U.S. Application Data

(60) Provisional application No. 60/323,088, filed on Sep. 19, 2001.

(30) Foreign Application Priority Data

Aug. 20, 2001  (JP)  ............................... 2001-248455

(51) Int. Cl.
*H01J 1/62* (2006.01)
*H01J 63/04* (2006.01)

(52) U.S. Cl. ....................... 313/499; 313/500; 313/501; 313/483

(58) Field of Classification Search .................. 313/409
See application file for complete search history.

(56) References Cited

U.S. PATENT DOCUMENTS

| 4,322,735 | A | * | 3/1982 | Sadamasa et al. ............. 257/89 |
| 4,929,866 | A | * | 5/1990 | Murata et al. ................ 313/500 |
| 5,005,057 | A |   | 4/1991 | Izumiya et al. |
| 5,042,043 | A |   | 8/1991 | Hatano et al. |
| 5,324,962 | A |   | 6/1994 | Komoto et al. |

(Continued)

FOREIGN PATENT DOCUMENTS

DE  19734034 A1  2/1998

(Continued)

*Primary Examiner*—Sikha Roy
*Assistant Examiner*—Natalie K Walford
(74) *Attorney, Agent, or Firm*—Sughrue Mion, PLLC

(57) ABSTRACT

The present invention provides a technique for fabricating a multicolor light-emitting lamp by using a blue LED having a structure capable of avoiding cumbersome bonding. In particular, the present invention provides a technique for fabricating a multicolor light-emitting lamp by using a heterojunction type GaP-base LED capable of emitting high intensity green light in combination. Also, for example, in fabricating a multicolor light-emitting lamp from the blue LED and the yellow LED, the present invention provides a technique for fabricating a multicolor light-emitting lamp from a blue LED requiring no cumbersome bonding and a hetero-junction type $GaAs_{1-Z}P_Z$-base yellow LED of emitting light having high light emission intensity.

15 Claims, 4 Drawing Sheets

U.S. PATENT DOCUMENTS

| | | | |
|---|---|---|---|
| 5,375,043 A * | 12/1994 | Tokunaga | 362/601 |
| 5,886,367 A | 3/1999 | Udagawa | |
| 6,069,021 A * | 5/2000 | Terashima et al. | 257/13 |
| 6,110,757 A | 8/2000 | Udagawa | |
| 6,220,722 B1 * | 4/2001 | Begemann | 362/231 |
| 6,936,863 B2 * | 8/2005 | Udagawa et al. | 438/47 |
| 7,030,003 B2 * | 4/2006 | Udagawa | 438/604 |

FOREIGN PATENT DOCUMENTS

| | | |
|---|---|---|
| EP | 395392 A2 | 10/1990 |
| GB | 2316226 A | 2/1998 |
| JP | 54-33748 A | 3/1979 |
| JP | 2-288388 | 11/1990 |
| JP | 4-209584 | 7/1992 |
| JP | 5-283744 A | 10/1993 |
| JP | 10-56202 | 2/1998 |
| JP | 10-242567 | 9/1998 |
| JP | 2000-12896 A | 1/2000 |
| JP | 2000-58451 | 2/2000 |

* cited by examiner

MULTICOLOR LIGHT-EMITTING LAMP AND LIGHT SOURCE

This application claims benefit of Provisional Application No. 60/323,088 filed Sep. 19, 2001, the disclosure of which is incorporated herein by reference.

TECHNICAL FIELD

The present invention relates to a technique for fabricating a multicolor light-emitting lamp which uses a plurality of light-emitting diodes (LED) and can emit multiple colors different in the wavelength.

BACKGROUND ART

A technique of fabricating an RGB-type multicolor light-emitting lamp by adjacently disposing light-emitting diodes (LED) capable of emitting each color of red light (R), green light (G) and blue light (B) which are the three primary colors of light has been heretofore known. For example, a technique of fabricating an RGB-type multicolor light-emitting lamp by integrating an LED (blue LED) of emitting blue band light having a light emission wavelength of 450 nm, a green LED of emitting green band light having a light emission wavelength of around 525 nm and a red LED of emitting red band light having a light emission wavelength of approximately from 600 to 700 nm is known (see, Display Gijutsu (Display Technique), 1st ed., 2nd imp., pages 100 to 101, Kyoritsu Shuppan (Sep. 25, 1998)).

Conventionally, a multicolor light-emitting lamp is fabricated by using a $Ga_XIn_{1-X}N$-base blue LED (see, JP-B-55-3834) where the light-emitting layer is composed of a group III-V compound semiconductor such as gallium indium nitride ($Ga_XIn_{1-X}N$: $0 \leq X \leq 1$) (see, III Zoku Chikkabutsu Handotai (Group III Nitride Semiconductor), pages 252 to 254, Baifukan (Dec. 8, 1999)). For the green LED, a $Ga_X In_{1-X}N$ green LED or a homo-junction type GaP green LED, which has gallium phosphide as a light-emitting layer, is used (see, (1) III Zoku Chikkabutsu Handotai (Group III Nitride Semiconductor), pages 249 to 252, supra, and (2) III-V Zoku Kagobutsu Handotai (Group III-V Compound Semiconductor), 1st ed., pages 253 to 261, Baifukan (May 20, 1994)). For the red LED, an LED having a light-emitting layer composed of a group III-V compound semiconductor such as aluminum gallium arsenide mixed crystal ($Al_XGa_{1-X}As$: $0<X<1$) or aluminum gallium indium phosphide (($Al_XGa_{1-X})_YIn_{1-Y}P$: $0 \leq X \leq 1$, $0<Y<1$) is used (see, Iwao Teramoto, Handotai Device Gairon (Outline of Semiconductor Device), pages 116 to 118, Baifukan (Mar. 30, 1995)).

Also, it is known that white light can be obtained by mixing complementary colors, for example, blue band light and yellow band light (see, Hikari no Enpitsu-Hikari Gijutsusha no tame no Oyo Kogaku-(Pencil of Light-Applied Optics for Optical Engineer), 7th ed., page 51, Shin Gijutsu Communications (Jun. 20, 1989)). For the yellow LED suitable to be combined with the blue LED, a homo-junction type GaAsP-base LED comprising a gallium arsenide phosphide ($GaAs_{1-Z}P_Z$: $0<Z<1$) light-emitting layer having a light emission wavelength of about 590 nm, and an aluminum gallium indium phosphide mixed crystal (($Al_XGa_{1-X})_YIn_{1-Y}P$: $0 \leq X \leq 1$, $0<Y<1$ generally Y=about 0.5) hetero-junction type LED can be suitably used (see, J. Crystal Growth, 221, pages 652 to 656 (2000)).

The gallium indium nitride ($Ga_XIn_{1-X}N$ ($0 \leq X \leq 1$))-base LED constituting a multicolor light-emitting lamp is usually fabricated using an electric insulating sapphire ($\alpha$-$Al_2O_3$ single crystal) as the substrate material (see, III Zoku Chikkabutsu Handotai (Group III Nitride Semiconductor), pages 243 to 252, supra). Since a current (operating current) for driving the LED cannot be passed through the insulating crystal substrate, both of positive and negative electrodes are disposed in the same surface side of the substrate. On the other hand, the homo-junction type GaP-base or homo-junction type $GaAs_{1-Z}P_Z$-base LED is fabricated by using an electrically conducting gallium phosphide (GaP) single crystal or gallium arsenide (GaAs) single crystal and therefore, only one electrode having either positive polarity or negative polarity is disposed in the surface side (see, Handotai Device Gairon (Outline of Semiconductor Device), page 117, supra).

In any case, when an RGB three color integration-type white lamp is fabricated by using conventional $Ga_XIn_{1-X}N$ ($0 \leq X \leq 1$)-base blue, green and red LEDs each comprising an insulating crystal substrate, both electrodes of positive polarity and negative polarity are disposed on the surface of each LED, therefore, wire bonding to electrodes of one polarity and wire bonding to electrodes of another polarity must be separately performed and this is cumbersome. If the polarity of the electrodes to be bonded can be unified to either positive or negative by making use of an electrically conducting substrate, particularly an electrically conducting substrate having the same conductivity, the cumbersome bonding can be avoided.

In recent years, a technique of fabricating a blue LED by using a boron-containing group III-V compound semiconductor layer and a light-emitting layer composed of a group III-V compound semiconductor, which are provided on an electrically conducting silicon single crystal (silicon), is disclosed (see, U.S. Pat. No. 6,069,021). If a blue LED using an electrically conducting substrate having the same conductivity as the substrate used for the fabrication of a green or red LED is used, an RGB-type multicolor light-emitting lamp can be readily fabricated without incurring cumbersome bonding operation as in conventional techniques.

On the other hand, the GaP-base or $GaAs_{1-Z}P_Z$-base LED constituting the multicolor light-emitting lamp together with the $Ga_XIn_{1-X}N$-base blue LED has a homo-junction type structure. Therefore, the light emission intensity of the GaP-base or $GaAs_{1-Z}P_Z$-base LED is lower than that of the $Ga_X In_{1-X}N$ ($0 \leq X \leq 1$) double hetero (DH)-junction type LED, failing in providing a multicolor light-emitting lamp well-balanced in view of the light emission intensity. If a hetero-junction type structure capable of exerting a "confinement" effect on carrier to cause light emission by radiation recombination is formed, this is expected to bring higher intensity light emission.

The present invention provides a technique for fabricating a multicolor light-emitting lamp by using a blue LED having a structure capable of avoiding cumbersome bonding. In particular, the present invention provides a technique for fabricating a multicolor light-emitting lamp by using a hetero-junction type GaP-base LED capable of emitting high intensity green light in combination. Also, for example, in fabricating a multicolor light-emitting lamp from the blue LED and the yellow LED, the present invention provides a technique for fabricating a multicolor light-emitting lamp from a blue LED requiring no cumbersome bonding and a hetero-junction type $GaAs_{1-Z}P_Z$-base yellow LED of emitting light having high light emission intensity. Furthermore, the present invention provides a light source fabricated from the multicolor light-emitting lamp according to the present invention.

DISCLOSURE OF THE INVENTION

More specifically, the present invention provides a multicolor light-emitting lamp having the characteristics described in the following (1) to (5):

(1) a multicolor light-emitting lamp fabricated by disposing a plurality of LEDs in combination, wherein a blue light-emitting diode (LED) of emitting blue band light is disposed and the blue light-emitting diode comprises a low-temperature buffer layer composed of an amorphous or polycrystalline boron-containing group III-V compound semiconductor and provided on an electrically conducting substrate surface, a barrier layer composed of a boron phosphide (BP)-base group III-V compound semiconductor containing boron (B) and phosphorus (P) and provided on the low-temperature buffer layer, and a light-emitting layer composed of a group III-V compound semiconductor and provided on the barrier layer;

(2) the multicolor light-emitting lamp as described in (1) above, wherein a hetero-junction type yellow LED of emitting yellow band light is disposed and the yellow LED comprises a light-emitting layer provided on a substrate and an upper barrier layer composed of a boron phosphide-base group III-V compound semiconductor layer and provided on the light-emitting layer;

(3) the multicolor light-emitting lamp as described in (1) or (2) above, wherein a hetero-junction type green LED of emitting green band light is disposed and the green LED comprises a light-emitting layer provided on a substrate and an upper barrier layer composed of a boron phosphide-base group III-V compound semiconductor layer and provided on the light-emitting layer;

(4) the multicolor light-emitting lamp as described in any one of (1) to (3) above, wherein a hetero-junction type red LED of emitting red band light is disposed and the red LED comprises a light-emitting layer provided on a substrate and an upper barrier layer composed of a boron phosphide-base group III-V compound semiconductor layer and provided on the light-emitting layer; and (5) the multicolor light-emitting lamp as described in any one of (1) to (4) above, wherein the substrate is formed of a single crystal having the same conduction type.

The present invention also provides:

(6) a light source using the multicolor light-emitting lamp described in any one of (1) to (5) above.

Figure 1:
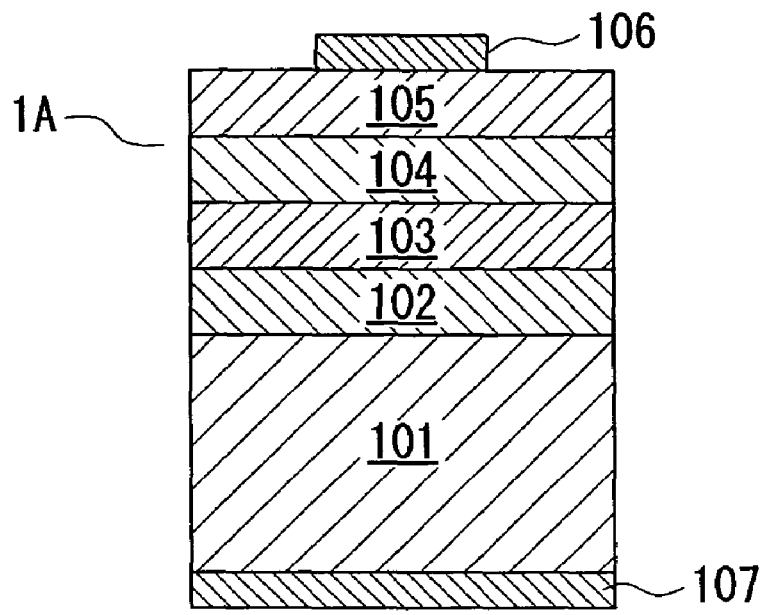
FIG. 1 is a schematic sectional view of a blue LED according to the present invention.

DESCRIPTION OF NUMERICAL REFERENCES 1A, 2A, 3A 4A LED
10, 20, 30 multicolor light-emitting lamp
40 light source
11 substrate
12 upper barrier layer
13 surface electrode
14 back-surface electrode
15 pad
16 metal film
17, 18, 19 terminal
101 single crystal substrate
102 buffer layer
103 lower barrier layer
104 light-emitting layer
105 upper barrier layer
106 surface electrode
107 back-surface electrode
108 compositional gradient layer
109 first GaP layer
110 second GaP layer

BEST MODE FOR CARRYING OUT THE INVENTION

FIG. 1 is a view schematically showing the cross-sectional structure of a blue LED 1A according to the first embodiment of the present invention. When an electrically conducting single crystal having an n-type or p-type conductivity is used for the substrate 101, an ohmic back-surface electrode 106 can be disposed on the back surface of the substrate 101 and therefore, a blue LED 1A can be readily fabricated. Examples of the single crystal material which is suitably used as the electrically conducting substrate 101 include semiconductor single crystals such as silicon single crystal (silicon), gallium phosphide (GaP), gallium arsenide (GaAs), silicon carbide (SiC) and boron phosphide (BP) (see, (1) *J. Electrochem. Soc.*, 120, pages 802 to 806 (1973), and (2) U.S. Pat. No. 5,042,043). In particular, an electrically conducting single crystal substrate having a low specific resistance (resistivity) of 10 mΩ·cm or less, preferably 1 mΩ·cm or less, can contribute toward providing an LED having a low forward voltage (so-called Vf).

On the single crystal substrate 101, a buffer layer 102 composed of a boron-containing group III-V compound semiconductor is provided for forming a lower barrier layer 103 having excellent crystallinity. The buffer layer 102 can be suitably composed of, for example, a boron phosphide-base semiconductor represented by the formula $B_\alpha Al_\beta Ga_\gamma In_{1-\alpha-\beta-\gamma} P_{1-\delta} As_\delta$ (wherein $0<\alpha\leq1$, $0\leq\beta<1$, $0\leq\gamma<1$, $0<\alpha+\beta+\gamma\leq1$ and $0\leq\delta<1$). The buffer layer 102 can also be composed of, for example, a nitrogen (N)-containing boron phosphide-base semiconductor represented by the formula $B_\alpha Al_\beta Ga_\gamma In_{1-\alpha-\beta-\gamma} P_{1-\delta} N_\delta$ (wherein $0<\alpha\leq1$, $0\leq\beta<1$, $0\leq\gamma<1$, $0<\alpha+\beta+\gamma\leq1$ and $0<\delta<1$). The buffer layer 102 is preferably composed of a binary or ternary mixed crystal which is small in the number of constituent elements and can be readily formed. Examples thereof include boron monophosphide (BP), boron aluminum phosphide mixed crystal ($B_\alpha Al_\beta P$: $0<\alpha\leq1$, $\alpha+\beta=1$), boron gallium phosphide mixed crystal ($B_\alpha Ga_\delta P$: $0<\alpha\leq1$, $\alpha+\delta=1$) and boron indium phosphide mixed crystal ($B_\alpha In_{1-\alpha} P$: $0<\alpha\leq1$).

In particular, the buffer layer (low-temperature buffer layer) 102 composed of an amorphous or polycrystalline boron-containing group III-V compound semiconductor layer formed at a low temperature exerts an effect of relaxing the lattice mismatch between the substrate 101 and the lower barrier layer 103 and giving a lower barrier layer 103 reduced in the density of crystal defects such as misfit dislocation (see, U.S. Pat. No. 6,029,021, supra). When the low-temperature buffer 102 is composed of a boron-containing group III-V compound semiconductor containing elements (constituent elements) constituting a boron-containing group III-V compound semiconductor of the lower barrier layer 103, the formation of a continuous lower barrier layer 103 is advantageously promoted by the action of the constituent elements as "growth nuclei". For example, an amorphous or polycrystalline $B_\alpha Al_\beta Ga_\gamma In_{1-\alpha-\beta-\gamma}P_{1-\delta}As_\delta$ layer (wherein $0<\alpha\leq 1$, $0\leq\beta<1$, $0\leq\gamma<1$, $0<\alpha+\beta+\gamma\leq 1$ and $0\leq\delta<1$) can be formed by an MOCVD method (see, Inst. Phys. Conf. Ser., No. 129, pages 157 to 162, IOP Publishing Ltd. (1993)) at a temperature of about 250 to 750° C. (see, U.S. Pat. No. 6,194,744). At a low temperature of about 500° C. or less, a boron-containing group III-V compound semiconductor with the major part being amorphous is readily obtained. In the high temperature region of approximately from 500 to 750° C., a boron-containing group III-V compound semiconductor layer mainly comprising polycrystalline is obtained. A low-temperature buffer layer 102 which is amorphous in the as-grown state is, when exposed to a high temperature environment of 750 to about 1,200° C., usually converted into a polycrystalline layer. Whether the buffer layer 102 is an amorphous layer or a polycrystalline layer can be known, for example, by the analysis of a diffraction pattern according to general X-ray diffraction or electron beam diffraction method. The layer thickness of the amorphous or polycrystalline layer constituting the low-temperature buffer layer 102 is preferably from about 1 nm to 100 nm, more preferably from 2 to 50 nm.

On the buffer layer 102, a lower barrier layer 103 composed of a boron-containing group III-V compound semiconductor is provided. The lower barrier layer 103 as an underlying layer (a layer on which a light-emitting layer 104 is deposited) of a light-emitting layer 104 is preferably composed of a boron phosphide (BP)-base group III-V compound semiconductor layer containing boron (B) and phosphorus (P), which is formed by using a boron phosphide (BP) having a band gap at room temperature of 3.0±0.2 eV as a matrix material. For example, the lower barrier layer 103 can be suitably composed of a boron gallium phosphide mixed crystal ($B_{0.50}Ga_{0.50}P$) having a band gap at room temperature of about 2.7 eV, which is a mixed crystal of monomer boron phosphide (boron monophosphide) having a band gap at room temperature of 3.0 eV and gallium phosphide (GaP, band gap at room temperature: about 2.3 eV). A boron phosphide layer having a high band gap at room temperature can be formed, in particular, by setting both the growth rate and the supply ratio of starting materials within respective prescribed ranges. The growth rate is preferably from 2 to 30 nm/min. In combination with this growth rate, when the supply ratio of the group V starting material and the group III starting material (so-called, V/III ratio) is controlled preferably to the range from 15 to 60, a boron phosphide layer having a high band gap at room temperature can be formed. The band gap can be determined, for example, from the photon energy dependency of the imaginary number part ($\epsilon_2=2\cdot n\cdot k$) in the complex dielectric constant determined from the refractive index (=n) and the extinction coefficient (=k).

The lower barrier layer 103 composed of a boron-containing group III-V compound semiconductor layer lattice-matching with the buffer layer 102 at the junction interface with the buffer layer 102 and lattice-matching with the light-emitting layer 104 on the surface in the light-emitting layer 104 side can contribute toward providing a high-quality light-emitting layer 104 reduced in the density of crystalline defects such as misfit dislocation or stacking fault. The lower barrier layer 103 lattice-matching with both the buffer layer 102 and the light-emitting layer 104 can be composed of, for example, a boron-containing group III-V compound semiconductor layer where a gradient is imparted to the composition of group III or V constituent element (see, JP-A-2000-22211) (the term "JP-A" as used herein means an "unexamined published Japanese patent application"). The compositional gradient of constituent element can be imparted by uniformly, stepwise or nonlinearly giving increase or decrease in the direction of the layer thickness increasing. For example, on the buffer layer 102 composed of a boron gallium phosphide mixed crystal ($B_{0.02}Ga_{0.98}P$) lattice-matching with the silicon substrate 101, the lower barrier layer 103 can be constructed by a boron gallium phosphide compositional gradient layer ($B_\alpha Ga_\delta P$: $\alpha=0.02\rightarrow 0.98$ and correspondingly thereto $\delta=0.98\rightarrow 0.02$) where the boron composition ratio (=$\alpha$) is linearly increased from 0.02 to 0.98 from the junction face with the buffer layer 102 toward the junction face with the light-emitting layer 104 composed of gallium indium nitride ($Ga_{0.90}In_{0.10}N$: lattice constant=about 4.557 Å).

The light-emitting layer 104 is composed of, for example, a group III-V compound semiconductor such as gallium indium nitride ($Ga_X In_{1-X}N$: $0\leq X\leq 1$), which can emit short wavelength visible light in the blue band (see, JP-B-55-3834, supra). The light-emitting layer 104 can also be composed of gallium nitride phosphide ($GaN_{1-X}P_X$: $0\leq X\leq 1$) (see, Appl. Phys. Lett., 60 (20), pages 2540 to 2542 (1992)). Furthermore, the light-emitting layer 104 can be composed of gallium nitride arsenide ($GaN_{1-X}As_X$: $0\leq X\leq 1$). The light-emitting layer 104 can be constructed by a single- or multi-quantum well structure having the above-described group III-V compound semiconductor layer as the well layer.

When an upper barrier layer 105 is provided on the light-emitting layer 104, a double hetero (DH) structure type light-emitting part can be constructed. The upper barrier layer 105 can be composed of the above-described monomer boron phosphide (boron monophosphide) having a band gap at room temperature of 3.0±0.2 eV or a boron phosphide (BP)-base group III-V compound semiconductor using this boron monophosphide as a matrix component. The upper barrier layer 105 can also be composed of a group III-V compound semiconductor such as gallium nitride (GaN) or aluminum gallium nitride mixed crystal ($Al_X Ga_{1-X}N$: $0<X<1$).

The double hetero-junction (DH) structure type LED 1A according to the present invention is fabricated, for example, by providing an ohmic surface electrode 106 on the upper barrier layer 105 and disposing an ohmic back-surface electrode 107 on the back surface of the substrate 101. In the case of constructing the upper barrier layer 105 from a boron-containing group III-V compound semiconductor, the p-type ohmic electrode can be composed of, for example, a gold.zinc (Au.Zn) alloy or a gold.beryllium (Au.Be) alloy. The n-type ohmic electrode can be formed of a gold alloy such as gold.germanium (Au.Ge) alloy, gold.indium (Au.In) alloy or gold.tin (Au.Sn) alloy. In order to form an electrode of exerting good ohmic contact property, the surface electrode 106 may also be provided on a contact layer having good conductivity. By using the boron-containing group III-V compound semiconductor layer having a high band gap according to the present invention, a contact layer suitable for the surface ohmic electrode 106 serving also as a window layer of transmitting emitted light in the pick up direction can be constructed.

Figure 2:
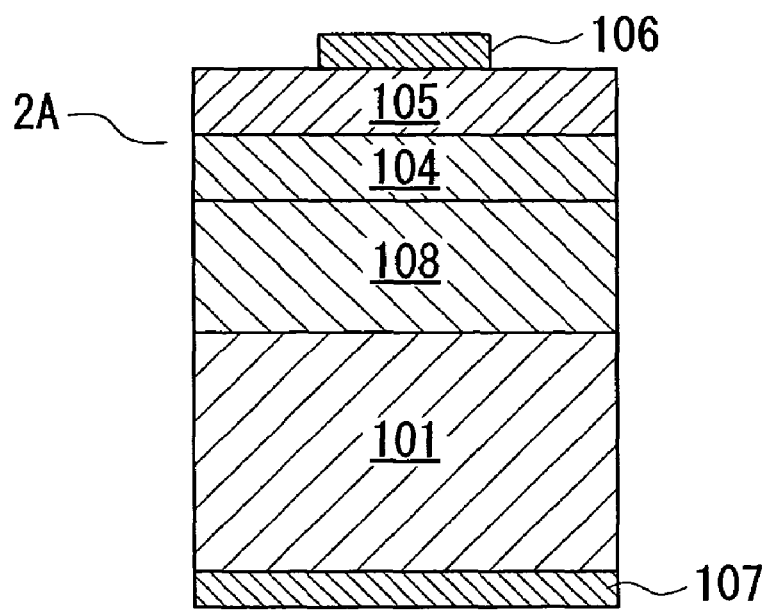
FIG. 2 is a schematic sectional view of a hetero-junction type yellow LED according to the present invention.

FIG. 2 is a view schematically showing an example of the cross-sectional structure of a hetero-junction type yellow LED 2A according to the second embodiment of the present invention. In FIG. 2, the same constituent elements as those shown in FIG. 1 are indicated by the same reference numbers.

The hetero-junction type yellow LED 2A is fabricated by using an n-type or p-type conductivity gallium arsenide (GaAs) single crystal as the substrate 101. In order to relax the lattice mismatch between the substrate 101 and the light-emitting layer 104, a compositional gradient layer 108 composed of, for example, $GaAs_{1-Z}P_Z$ is provided between the substrate 101 and the light-emitting layer 104. By this means of relaxing the lattice mismatch, a light-emitting layer 104 having good crystallinity can be obtained.

The light-emitting layer 104 is composed of, for example, an n-type or p-type gallium arsenide phosphide ($GaAs_{1-Z}P_Z$). In particular, the light-emitting layer 104 composed of $GaAs_{1-Z}P_Z$ containing nitrogen (N) as an isoelectronic trap is advantageous in giving high-intensity light emission. For example, a light-emitting layer composed of $GaAs_{0.25}P_{0.75}$ having an arsenic (As) composition ratio (=1-Z) of about 0.25 can emit yellow band light having a wavelength of about 580 nm.

The hetero-junction type yellow LED 2A according to the present invention is characterized by the structure where an upper barrier layer 105 composed of a boron-containing group III-V compound semiconductor is provided on the light-emitting layer 104. The upper barrier layer 105 can be particularly suitably composed of the above-described boron monophosphide (BP) having a band gap at room temperature of 3.0±0.2 eV or a boron phosphide (BP)-base group III-V compound semiconductor using this boron monophosphide as a matrix component. The upper barrier layer 105 composed of a boron-containing group III-V compound semiconductor having such a high band gap can serve also as an emitted light-transmitting layer (window layer) suitable for transmitting the emitted light outside. By virtue of the activity exerted by the upper barrier layer 105 of "confining" carrier and efficiently transmitting emitted light outside, a hetero-junction type yellow LED 2A having high light emission intensity can be obtained.

In particular, when the upper barrier layer 105 hetero-joined on the light-emitting layer 104 is composed of a boron phosphide-base group III-V compound semiconductor with the major part being amorphous formed at a relatively low temperature of 250 to 750° C., this provides an effect of preventing thermal deterioration of the light-emitting layer 104 due to heat. That is, good crystallinity of the light-emitting layer 104 can be maintained and therefore, a light-emitting layer 104 of giving high-intensity light emission can be provided.

Figure 3:
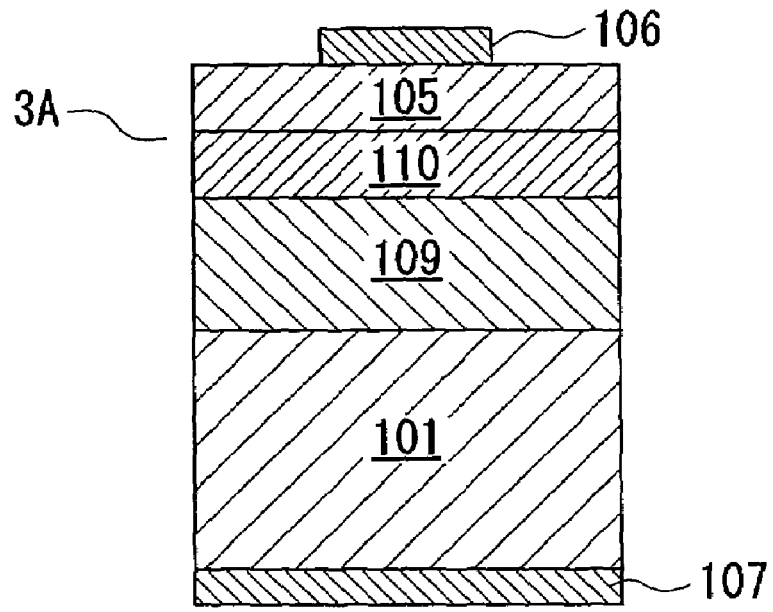
FIG. 3 is a schematic sectional view of a hetero-junction type green LED according to the present invention.

FIG. 3 is a view schematically showing an example of the cross-sectional structure of a hetero-junction type green LED 3A according to the third embodiment of the present invention. In FIG. 3, the same constituent elements as those shown in FIG. 1 or 2 are indicated by the same reference numbers.

The green LED 3A is fabricated by using an n-type or p-type conductivity gallium phosphide (GaP) single crystal as the substrate 101. On the substrate 101, a first n-type or p-type gallium phosphide (GaP) 109 is provided, for example, by a liquid phase epitaxial (LPE) growth method. On the first GaP layer 109, a second GaP layer 110 having a conduction type opposite that of the first GaP layer 109 is provided, for example, by an LPE growth method. The pn-junction type light-emitting portion is constructed by the first GaP layer 109 and the second GaP layer 110. When the light-emitting layer, for example, the second GaP layer 110 is composed of GaP doped with nitrogen (N) as an isoelectronic trap, a light-emitting layer of giving high-intensity light emission can be provided.

The hetero-junction type green LED 3A according to the present invention is a hetero-junction type LED where an upper barrier layer 105 composed of a boron phosphide-base group III-V compound semiconductor is provided on the second GaP layer 110 serving as a light-emitting layer. The hetero-junction type structure can be constructed by providing the upper barrier layer 105 on the light-emitting layer. The upper barrier layer 105 can be particularly suitably composed of the above-described boron monophosphide (BP) having a band gap at room temperature of 3.0±0.2 eV or a boron phosphide-base group III-V compound semiconductor using this boron monophosphide as a matrix component. The upper barrier layer 105 composed of a boron phosphide-base group III-V compound semiconductor having such a high band gap exerts an effect of confining carrier in the light-emitting layer and at the same time, acts as an emitted light-transmitting layer (window layer) suitable for transmitting emitted light outside. This can contribute toward providing a hetero-junction type green LED 3A having high light emission intensity.

In particular, when the upper barrier layer 105 hetero-joined on the light-emitting layer is composed of a boron phosphide-base group III-V compound semiconductor with the major part being amorphous formed at a relatively low temperature of 250 to 750° C., this provides an effect of preventing thermal deterioration of the light-emitting layer due to heat. That is, good crystallinity of the light-emitting layer 104 can be maintained and therefore, a light-emitting layer 104 of giving high-intensity light emission can be provided.

Figure 4:
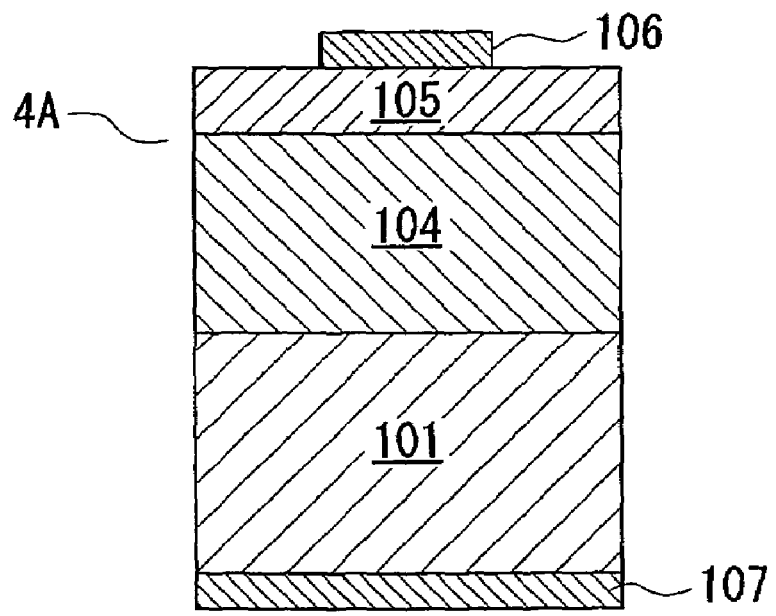
FIG. 4 is a schematic sectional view of a hetero-junction type red LED according to the present invention.

The hetero-junction type red LED 4A according to the fourth embodiment of the present invention can be fabricated by a GaP-base LED having a cross-sectional structure shown in FIG. 4. In FIG. 4, the same constituent elements as those shown in FIGS. 1 to 3 are indicated by the same reference numbers.

In the hetero-junction type GaP-base red LED 4A, the light-emitting layer 104 can be constructed as a p-type GaP layer doped with both zinc (Zn) and oxygen (O). The hetero-junction type red LED 4A can be fabricated by providing an upper barrier layer 105 composed of a boron phosphide-base group III-V compound semiconductor having a conduction type opposite the light-emitting layer 104, on the light-emitting layer 104 obtained by the growth means such as LPE method or MOCVD method. The upper barrier layer 105 making hetero-junction with the light-emitting layer 104 can be particularly suitably composed of the above-described boron monophosphide (BP) having a band gap at room temperature of 3.0±0.2 eV or a boron phosphide-base group III-V compound semiconductor using the boron monophosphide as a matrix component. The upper barrier layer 105 composed of a boron phosphide-base group III-V compound semiconductor having such a high band gap exerts an effect of confining carriers in the light-emitting layer 104 and moreover, acts as an emitted light-transmitting layer (window layer) suitable for the transmission of emitted light to the outside. This can contribute toward providing a hetero-junction type red LED 4A having high light emission intensity.

In particular, according to the means of allowing the upper barrier layer 105 composed of a boron phosphide-base group III-V compound semiconductor with the major part being amorphous formed at a relatively low temperature of 250 to 750° C. to make hetero-junction on the light-emitting layer 104, an effect of preventing the light-emitting layer 104 from thermal deterioration due to heat can be provided. That is, good crystallinity of the light-emitting layer 104 can be maintained and therefore, a light-emitting layer 104 giving high-intensity light emission can be provided.

The hetero-junction type red LED can also be fabricated, for example, from an aluminum gallium indium phosphide (AlGaInP)-base LED using an aluminum gallium indium phosphide mixed crystal $((Al_XGa_{1-X})_YIn_{1-Y}P$: $0<X<1$, $0<Y<1$) as the light-emitting layer (see, J. Crystal Growth, 221, pages 652 to 656 (2000), supra). The AlGaInP-base mixed crystal LED is advantageous in that light emission of higher intensity can be obtained as compared with the GaP red LED. In particular, from an ohmic electrode dispersion-type AlGaInP-base mixed crystal LED where surface electrodes are disposed to disperse on the upper barrier layer, high-intensity red light is emitted because a device driving current can be almost uniformly passed through the entire surface of the light-emitting layer (see, J. Crystal Growth, supra, 221 (2000), supra).

When hetero-junction type yellow, green and red LEDs 2A to 4A are fabricated using an electrically conducting substrate 101 having the same conduction type as the blue LED, an ohmic electrode 107 having the same polarity can be provided on the back surface of the substrate 101. Accordingly, by earthing to one pad common in the polarity, a multicolor light-emitting lamp can be readily fabricated. The polarity of the surface electrode 106 of the LED can also be unified and therefore, a multicolor light-emitting lamp can be readily fabricated only by the wire bonding operation to the surface electrode having either one polarity. Preferred examples of the fifth embodiment of the present invention include the case where a multicolor light-emitting lamp is fabricated by assembling a blue LED 1A using a boron (B)-doped p-type silicon single crystal (silicon) as the substrate 101, a hetero-junction type green LED 3A using a zinc (Zn)-doped p-type gallium phosphide (GaP) single crystal as the substrate 101, and a hetero-junction type red LED 4A using a zinc (Zn)-doped p-type gallium arsenide (GaAs) single crystal as the substrate. A multicolor light-emitting lamp can also be fabricated by assembling a blue LED 1A using a phosphorus (P)- or antimony (Sb)-doped n-type silicon as the substrate 101 and a hetero-junction type yellow LED 2A using a silicon (Si)-doped n-type gallium arsenide as the substrate 101. In other words, when LEDs unified to either so-called n-side up type or p-side up type are used, a multicolor light-emitting lamp can be readily obtained while avoiding a cumbersome bonding operation as in conventional techniques.

Figure 5:
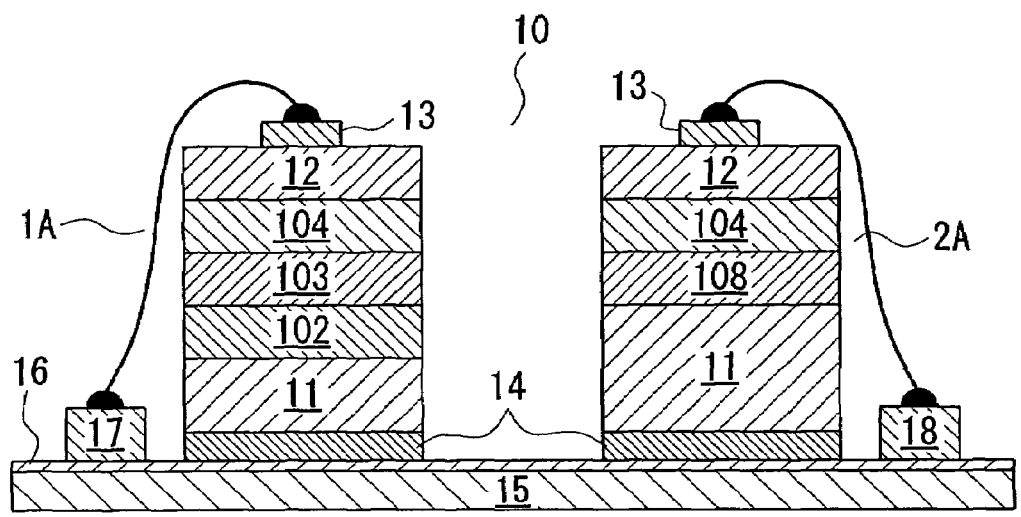
FIG. 5 is a schematic sectional view of a multicolor light-emitting lamp according to the present invention.

The multicolor light-emitting lamp 10 according to the present invention can be fabricated through the following steps. As shown in FIG. 5, for example, an n-side up type blue LED 1A and a hetero-junction type yellow LED 2A are fixed to a metal film 16 on a pad 15 plated with a metal such as silver (Ag) or aluminum (Al), using an electrically conducting adhesive material. Back-surface electrodes 14 provided on respective back surfaces of electrically conducting substrates 11 used for fabricating LEDs 1A and 2A are electrically connected to the pad 15. Also, surface electrodes 13 disposed, for example, on respective upper barrier layers 12 of LEDs 1A and 2A are connected to terminals 17 and 18 attached to the pad 15. In the case of causing an excessively large difference in luminous emission intensity, terminals 17 and 18 exclusive to respective LEDs 1A and 2A may be individually provided to employ a mechanism capable of adjusting the luminance by individually controlling the currents flowing to LEDs 1A and 2A, so that color mixing can be advantageously attained and a multicolor light-emitting lamp 10 can be readily obtained.

By assembling multicolor light-emitting lamps 10 according to the present invention, a light source can be fabricated. For example, a constant voltage driving-type white light source can be fabricated by electrically connecting a plurality of white lamps 10 in parallel. Also, a constant current driving-type multicolor light source can be fabricated by electrically connecting multicolor light-emitting lamps in series. This multicolor light source does not require so large electric power energy on lighting as compared with conventional incandescent fluorescence light sources and therefore, is useful as a low power consumption-type multicolor light source having a long life. For example, these light sources can be used as a light source for room lighting and also as a multicolor light source for outdoor display or indirect illumination.

EXAMPLES

Example 1

The present invention is described in detail below by referring to a multicolor light-emitting lamp fabricated by combining a blue LED using a silicon substrate and a $GaAs_{1-Z}P_Z$-base yellow LED.

Figure 6:
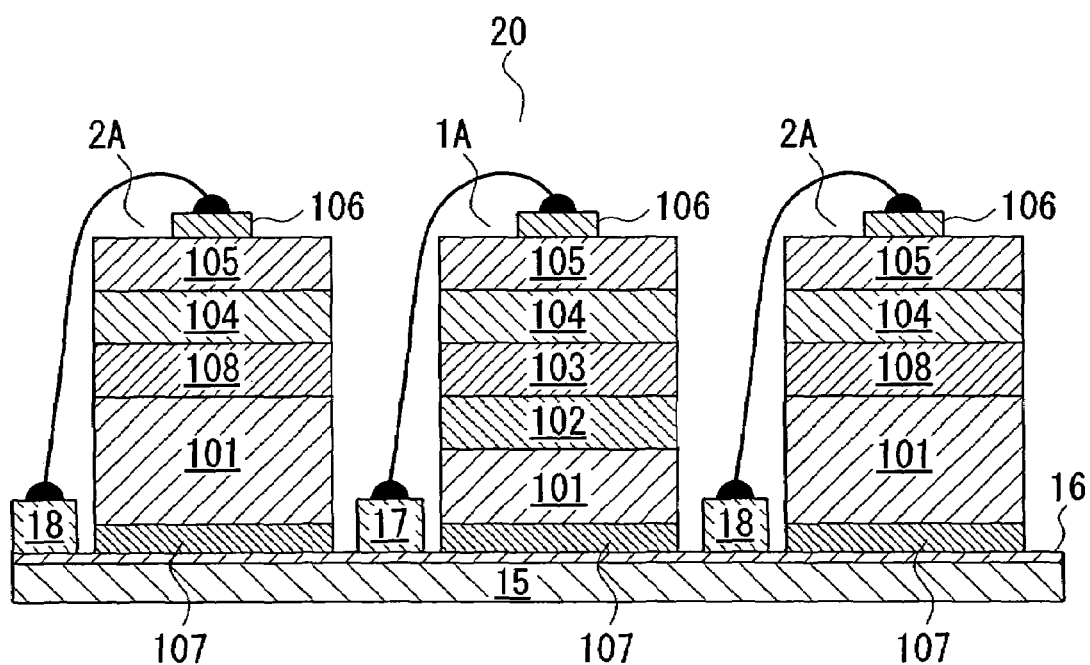
FIG. 6 is a schematic sectional view of a multicolor light-emitting lamp according to Example 1.

FIG. 6 shows a schematic sectional view of the multicolor light-emitting lamp 20 according to Example 1. The multicolor light-emitting lamp 20 was fabricated by assembling one blue LED 1A and two yellow LEDs 2A in order to balance the light emission intensity between blue band light and yellow band light.

The blue LED 1A used was an n-side up type LED fabricated by disposing ohmic surface and back-surface electrodes described in (6) and (7) below on a stacked layer structure where functional layers described in (2) to (5) below were stacked in sequence on a substrate 101 described in (1) below.

(1) A boron (B)-doped p-type (111)-Si single crystal substrate 101.

(2) A buffer layer 102 composed of boron phosphide (BP) having a layer thickness of 5 nm, which was grown at 350° C. by an atmospheric pressure MOCVD method using a system of triethylboran $((C_2H_5)_3B)$/phosphine $(PH_3)$/hydrogen $(H_2)$.

(3) A lower barrier layer 103 (carrier concentration: about $4\times10^{18}$ cm$^{-3}$, layer thickness: about 700 nm) composed of p-type boron phosphide (BP) mainly comprising (110) crystal planes oriented almost in parallel on the surface of the substrate 101, which was doped with magnesium (Mg) at 850° C. using the above-described MOCVD gas phase growth method.

(4) A light-emitting layer 104 (carrier concentration: about $3\times10^{17}$ cm$^{-3}$, layer thickness: about 180 nm) mainly composed of a cubic n-type $Ga_{0.94}In_{0.06}N$ layer (lattice constant: 4.538 Å).

(5) An upper barrier layer 105 (carrier concentration: about $8\times10^{16}$ cm$^{-3}$, layer thickness: about 480 nm) composed of an n-type boron phosphide (BP) layer with the major part being amorphous, having a band gap at room temperature of 3.1 eV, which was grown at 400° C. by the above-described MOCVD reaction system.

(6) An ohmic surface electrode 106 composed of a gold.germanium (Au.Ge) circular electrode (diameter: 120 μm), which was disposed in the center of the upper barrier layer 105.

(7) An ohmic back-surface electrode 107 composed of aluminum (Al), which was provided almost throughout the back surface of the p-type Si substrate 101.

The blue LED 1A used was an LED exhibiting the following properties (a) to (d):
(a) Light emission center wavelength: 430 nm
(b) Luminance: 6 millicandela (mcd)
(c) Forward voltage: 3 volt (V) (forward current: 20 milliampere (mA))
(d) Reverse voltage: 8 V (reverse current: 10 μA)

The yellow LED 2A used was an n-side up type LED fabricated by disposing ohmic surface and back-surface electrodes described in (5) and (6) below on a stacked layer structure where functional layers described in (2) to (4) below were stacked in sequence on a substrate 101 described in (1) below.

(1) A zinc (Zn)-doped p-type (100)-GaAs single crystal substrate 101.

(2) A Zn-doped p-type $GaAs_{1-z}P_z$ compositional gradient layer (carrier concentration: about $1\times10^{18}$ cm$^{-3}$, layer thickness: 15 μm) 108 grown at 720° C. by a hydride vapor phase epitaxy (VPE) method using a system of gallium (Ga)/arsine ($AsH_3$)/hydrogen ($H_2$).

(3) A silicon (Si)-doped n-type $GaAs_{0.25}P_{0.75}$ light-emitting layer 104, which was grown at 720° C. by using the above-described hydride VPE means and doped with nitrogen (N) as an isoelectronic impurity.

(4) An upper barrier layer 105 (carrier concentration: about $4\times10^{18}$ cm$^{-3}$, layer thickness: about 750 nm) composed of an n-type boron phosphide arsenide ($BP_{0.95}As_{0.05}$) layer with the major part being amorphous, having a band gap at room temperature of 2.7 eV, which was grown at 400° C. by the MOCVD using a reaction system of $(C_2H_5)_3B/PH_3/(H_2)$.

(5) An ohmic surface electrode 106 composed of a gold.germanium (Au.Ge) circular electrode (diameter: 120 μm), which was disposed in the center of the upper barrier layer 105.

(6) An ohmic back-surface electrode 107 composed of gold.zinc (Au.Zn), which was provided almost throughout the back surface of the p-type GaAs substrate 101.

The yellow LED 2A used was an LED exhibiting the following properties (a) to (d).
(a) Light emission center wavelength: 580 nm
(b) Luminance: 3 millicandela (mcd)
(c) Forward voltage: 2 volt (V) (forward current: 20 mA)
(d) Reverse voltage: 5 V (reverse current: 10 μA)

The multicolor light-emitting lamp 20 obtained by assembling the blue LED 1A and the yellow LED 2A each having a square shape with a one-side length of 300 μm was fabricated through the following steps (A) to (B):

(A) a step of fixing respective p-type back-surface electrodes 107 of LEDs 1A and 2A to a metal film 16 on a common pad 15 using, for example, an electrically conducting adhesive material by chip-on-board means, and (B) a step of individually bonding n-type surface electrodes 106 of LED 1A and 2A to two terminals 17 and 18 electrically insulated from the pad 15, by wedge bonding means or ball bonding means.

The multicolor light-emitting lamp 20 was fabricated by individually applying bonding to LEDs 1A and 2A and therefore, can be used as a blue single light lamp or as a lamp emitting single light in the yellow band. When a current is passed to the blue LED 1A and the yellow LED 2A at the same time, a multicolor lamp which can be used as a white lamp is provided.

Example 2

The present invention is described in detail below by referring to the case of fabricating an RGB-type multicolor light-emitting lamp containing a blue LED using a silicon substrate.

Figure 7:
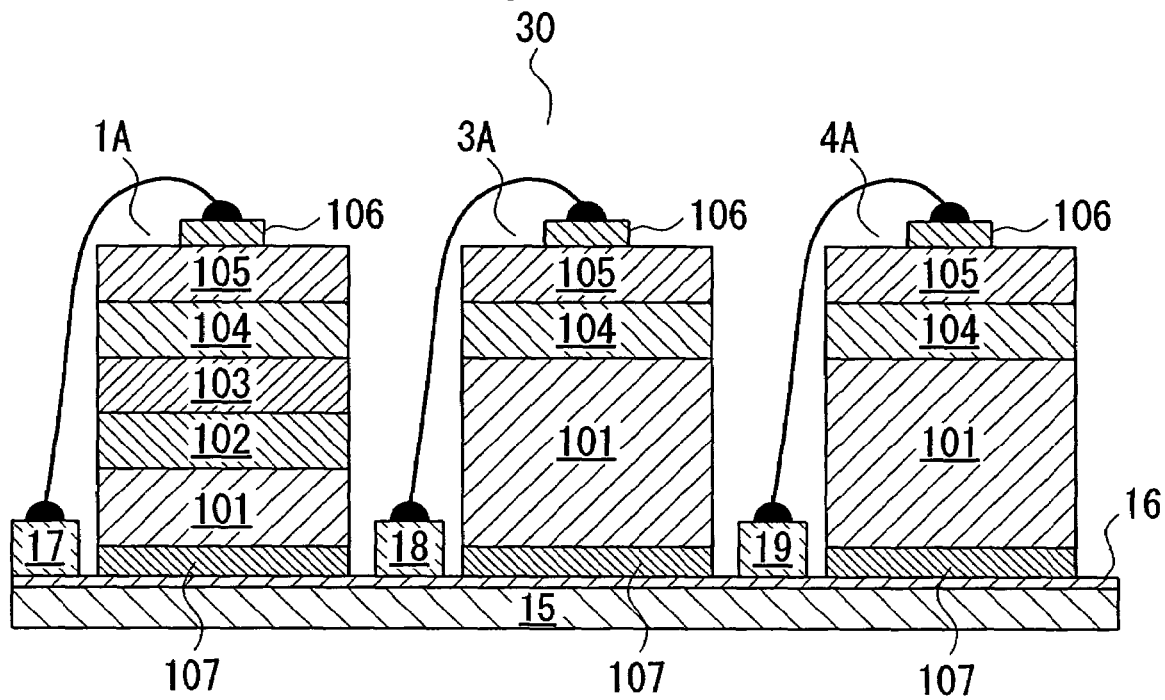
FIG. 7 is a schematic sectional view of a multicolor light-emitting lamp according to Example 2.

FIG. 7 is a schematic sectional view showing the construction of the multicolor light-emitting lamp 30 according to Example 2. The RGB-type multicolor light-emitting lamp 30 was fabricated by combining the blue LED 1A described in Example 1, a hetero-junction type GaP green LED 3A and a hetero-junction type AlGaAs red LED 4A.

The blue LED 1A was fabricated by disposing ohmic surface and back-surface electrodes described in (6) and (7) below on a stacked layer structure where functional layers described in (2) to (5) below were stacked in sequence on a substrate 101 described in (1) below. The p-side up type blue LED 1A of Example 2 was a double hetero (DH)-junction type LED exhibiting the same light emitting properties as the n-side up type blue LED 1A of Example 1.

(1) A phosphorus (P)-doped n-type (100)-Si single crystal substrate 101.

(2) A buffer layer 102 composed of an n-type boron indium phosphide mixed crystal ($B_{0.33}In_{0.67}P$) lattice-matching with the Si single crystal (lattice constant: about 5.431 Å) constituting the substrate 101, which was grown to a layer thickness of 15 nm at 400° C. by an atmospheric pressure MOCVD method using a system of triethylboran ($(C_2H_5)_3B$)/phosphine ($PH_3$)/hydrogen ($H_2$).

(3) A lower barrier layer 103 (carrier concentration: about $1\times10^{18}$ cm$^{-3}$, layer thickness: about 560 nm) composed of an n-type boron indium phosphide ($B_XIn_{1-X}P$: X=0.33→0.98) mainly comprising (110) crystal planes oriented almost in parallel on the surface of the substrate 101, which was doped with silicon (Si) at 850° C. using the above-described MOCVD vapor phase growth means. The boron (B) composition ratio (=X) in the boron indium phosphide ($B_XIn_{1-X}P$) compositional gradient layer was set to X=0.33 at the junction interface with the buffer layer 102 and X=0.98 on the surface joined with the light-emitting layer 104.

(4) A light-emitting layer 104 (carrier concentration: about $4\times10^{17}$ cm$^{-3}$, layer thickness: about 150 nm) mainly composed of a cubic n-type $Ga_{0.90}In_{0.10}N$ layer (lattice constant: 4.557 Å).

(5) An upper barrier layer 105 (carrier concentration: about $2\times10^{19}$ cm$^{-3}$, layer thickness: about 400 nm) composed of a magnesium (Mg)-doped p-type boron indium phosphide ($B_{0.98}In_{0.02}P$, lattice constant: about 4.557 Å) layer with the major part being amorphous, having a band gap at room temperature of 3.1 eV, which was grown at 400° C. by the above-described MOCVD reaction system.

(6) An ohmic surface electrode 106 composed of a gold.zinc (Au.Zn) circular electrode (diameter: 130 μm), which was disposed in the center of the upper barrier layer 105.

(7) An ohmic back-surface electrode 107 composed of aluminum (Al), which was provided almost throughout the back surface of the n-type Si substrate 101.

The hetero-junction type GaP-base green LED 3A used was a p-side up type single hetero (SH)-junction type LED fabricated by disposing ohmic surface and back-surface electrodes described in (4) and (5) below on a stacked layer structure where functional layers described in (2) and (3) were stacked in sequence on a substrate 101 described in (1) below.

(1) A silicon (Si)-doped n-type (100) 2° off-GaP single crystal substrate 101.

(2) A light-emitting layer composed of silicon (Si)-doped n-type GaP, which was grown at 800° C. by a general liquid phase epitaxy (LPE) method (see, III-V Zoku Kagobutsu Handotai (Group III-V compound Semiconductor), pages 253 to 256, supra) and doped with nitrogen (N) as an isoelectronic trap to an atomic concentration of $6\times10^{18}$ cm$^{-3}$.

(3) An upper barrier layer 105 (carrier concentration: about $3\times10^{19}$ cm$^{-3}$, layer thickness: about 400 nm) composed of a p-type boron phosphide (BP) layer with the major part being amorphous, having a band gap at room temperature of 3.0 eV, which was grown at 380° C. by the above-described MOCVD reaction system.

(4) An ohmic surface electrode 106 composed of a gold-.beryllium (Au.Be) circular electrode (diameter: 110 μm), which was disposed in the center of the upper barrier layer 105.

(5) An ohmic back-surface electrode 107 composed of a gold.germanium alloy (Au: 95 wt %, Ge: 5 wt %), which was provided almost throughout the back surface of the n-type GaP substrate 101.

The hetero-junction type GaP green LED 3A used was an LED exhibiting the following properties (a) to (d).

(a) Light emission center wavelength: 555 nm (b) Luminance: 5 millicandela (mcd)

(c) Forward voltage: 2 volt (V) (forward current: 20 milliampere (mA))

(d) Reverse voltage: 5 V (reverse current: 10 μA)

The hetero-junction type red LED 4A used was a pn-junction type LED using a silicon (Si)-doped n-type (100)-Si single crystal as the substrate 101 and having a light-emitting layer 104 composed of an n-type aluminum gallium arsenide (AlGaAs) and an upper barrier layer 105 composed of a p-type boron phosphide (BP) layer. The main properties of the p-side up type red LED 4A are shown below.

(a) Light emission center wavelength: 660 nm (b) Luminance: 8 millicandela (mcd)

(c) Forward voltage: 2 volt (V) (forward current: 20 milliampere (mA))

(d) Reverse voltage: 5 V (reverse current: 10 μA)

An RGB-type multicolor light-emitting lamp 30 was fabricated by assembling the blue LED 1A, the hetero-junction type green LED 3A and the hetero-junction type red LED 4A each having a square shape with a one-side length of about 250 μm, through the following steps (A) to (B):

(A) a step of fixing respective n-type back-surface electrodes 107 of LEDs 1A, 3A and 4A to a metal film 16 on a common pad 15 using, for example, an electrically conducting adhesive material by chip-on-board means, and (B) a step of individually bonding p-type surface electrodes 106 of LEDs 1A, 3A and 4A to three terminals 17 to 19 electrically insulated from the pad 15, by wedge bonding means or ball bonding means.

The multicolor light-emitting lamp 30 is fabricated by individually applying bonding to LEDs 1A, 3A and 4A and therefore, can be used also as a single light lamp of blue band, green band or red band. In particular, the lamp 30 of Example 2 uses a hetero-junction type GaP-base LED 3A having a boron-containing group III-V semiconductor layer and therefore, can be used also as a lamp of emitting high-luminance single light of green band. In addition, LEDs 1A, 3A and 4A are individually applied with bonding and therefore, the forward current passing to each LED can be individually controlled and mixed color light of RGB can be generated. Furthermore, by lighting LEDs 1A, 3A and 4A at the same time, an RGB-type multicolor light-emitting lamp 30 capable of emitting white light can be provided.

Example 3

The present invention is described below by referring to the case of constructing a light source by assembling the RGB-type multicolor light-emitting lamps 30 described in Example 2.

Figure 8:
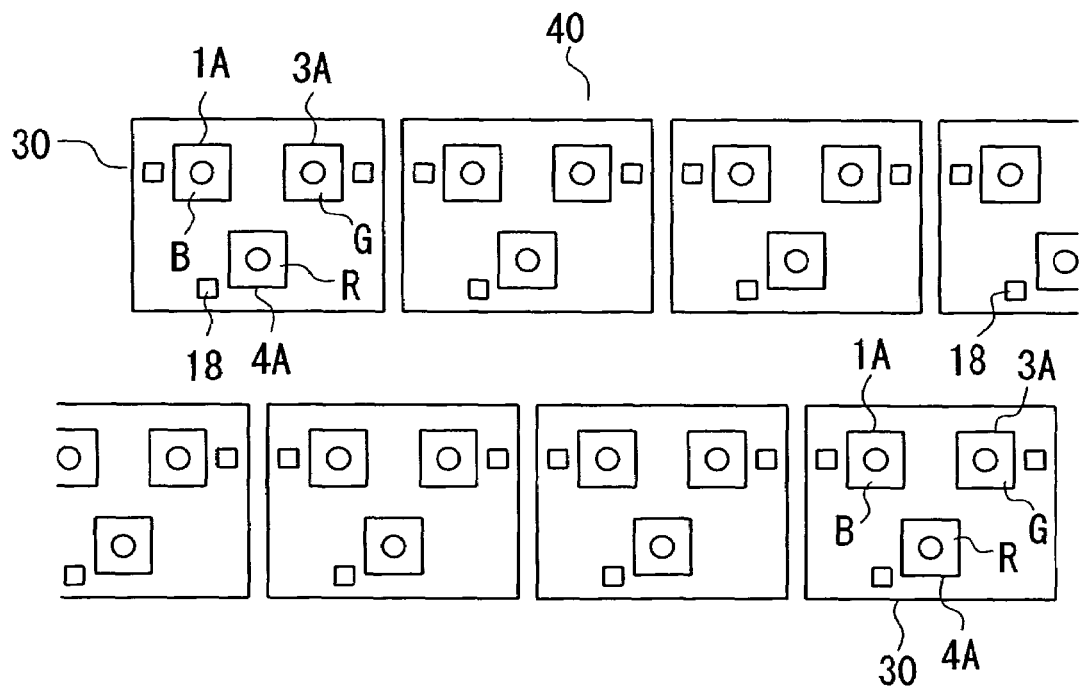
FIG. 8 is a plan view showing the structure of a light source using multicolor light-emitting lamps, according to Example 3.

FIG. 8 is a plan view showing the light source 40 according to the present invention, which is fabricated, for example, by regularly arraying the RGB type multicolor light-emitting lamps 30 at equal intervals. By applying wiring capable of passing a forward current under control to individual terminals 18 of lamps 30 arrayed, the chromaticity can be adjusted and a multicolor lamp for use in display and the like can be fabricated.

INDUSTRIAL APPLICABILITY

According to the present invention, a multicolor light-emitting lamp or a light source is fabricated by using a hetero-junction type light-emitting device having a boron phosphide-base group III-V compound semiconductor layer as a barrier layer, for example, a hetero-junction type GaP-base green LED or a hetero-junction type GaAs$_{1-z}$P$_z$-base LED, so that, for example, an RGB mixed color-type multicolor light-emitting lamp of giving high-intensity light emission can be provided.

Furthermore, according to the present invention, a multicolor light-emitting lamp or a light source is fabricated by using a light-emitting device of emitting blue band light, where an electrically conducting substrate is used and an electrode is provided on the back surface of the substrate, for example, a blue LED having a boron-containing group III-V compound semiconductor layer, so that a high-intensity multicolor light emitting lamp or light source can be provided by an easy bonding operation.

The invention claimed is:

1. A multicolor light-emitting lamp fabricated by disposing a plurality of LEDs by combining at least a blue light emitting diode (LED), a green LED and a red LED, wherein the blue LED comprises a low-temperature buffer layer composed of an amorphous or polycrystalline boron-containing group III-V compound semiconductor and provided on an electrically conducting substrate surface, a lower barrier layer composed of a boron phosphide (BP)-base group III-V compound semiconductor containing boron (B) and phosphorus (P) and provided on the low-temperature buffer layer, a light-emitting layer composed of a group III-V compound semiconductor and provided on the lower barrier layer, and an upper barrier layer composed of a boron phosphide-base group III-V compound semiconductor formed on the light emitting layer, wherein the green LED is a hetero-junction type LED of emitting green band light and comprises a light-emitting layer provided on a single crystal substrate and an upper barrier layer composed of a boron phosphide-base group III-V compound semiconductor layer and provided on the light-emitting layer, wherein the red LED is a hetero-junction type LED of emitting red band light and comprises a light-emitting layer provided on a single crystal substrate and an upper barrier layer composed of a boron phosphide-base group III-V compound semiconductor layer and provided on the light-emitting layer, wherein each of the LEDs for providing the multicolor light emitting lamp is formed on an upper surface of a single crystal substrate having the same conduction type, wherein a back-surface ohmic electrode having a first polarity is provided on a lower surface of the single crystal substrate of each of the LED, and wherein a front-surface ohmic electrode having a second polarity opposite to said first polarity is provided on a side of each of the LEDs opposite the back-surface ohmic electrode.

2. The multicolor light-emitting lamp according to claim 1, wherein a hetero-junction type yellow LED of emitting yellow band light is disposed and the yellow LED comprises a light-emitting layer provided on a single crystal substrate having the same conduction type as that of the blue LED and an upper barrier layer composed of a boron phosphide-base group III-V compound semiconductor layer and provided on the light-emitting layer.

3. A light source comprising a multicolor light-emitting lamp according to claim 1 or 2.

4. A light source comprising a multicolor light-emitting lamp according to claim 1.

5. A light source comprising a multicolor light-emitting lamp according to claim 2.

6. The multicolor light-emitting lamp according to claim 2, comprising a yellow light emitting diode including a GaAsP light-emitting layer.

7. The multicolor light-emitting lamp according to claim 1, comprising a green LED including a GaP light-emitting layer and a red LED including a AlGaAs light-emitting layer.

8. The multicolor light-emitting lamp according to claim 1, comprising a green LED including a GaP light-emitting layer and a red LED including a GaP light-emitting layer.

9. The multicolor light-emitting lamp according to claim 1, wherein the light-emitting layer of said blue LED is a GaInN light-emitting layer, and said multicolor light-emitting lamp comprises a green light emitting diode including a GaP light-emitting layer and a red light emitting diode including a GaP light-emitting layer.

10. The multicolor light-emitting lamp according to claim 1, further comprising a metal film disposed on a conductive pad, and wherein the back-surface ohmic electrodes of each of said blue LED, said green LED and said red LED are fixed to said metal film so as to electrically connect respective back-surface ohmic electrodes of said first polarity to one another.

11. The multicolor light-emitting lamp according to claim 1, wherein the front-surface ohmic electrodes are provided on respective upper barrier layers of each of said blue LED, said green LED and said red LED.

12. The multicolor light-emitting lamp according to claim 1, wherein the color light emitting diodes other than the blue LED have a single hetero-junction structure, and the blue LED has a double hetero-junction structure.

13. The multicolor light-emitting lamp according to claim 2, wherein the yellow LED has a single hetero-junction structure, and the blue LED has a double hetero-junction structure.

14. The multicolor light-emitting lamp according to claim 1, wherein the green LED has a single hetero-junction structure, and the blue LED has a double hetero-junction structure.

15. The multicolor light-emitting lamp according to claim 1, wherein the red LED has a single hetero-junction structure, and the blue LED has a double hetero-junction structure.

* * * * *